(12) United States Patent
Kim et al.

(10) Patent No.: US 7,282,648 B2
(45) Date of Patent: Oct. 16, 2007

(54) CAPACITOR-EMBEDDED PCB HAVING BLIND VIA HOLE AND METHOD OF MANUFACTURING THE SAME

(75) Inventors: Han Kim, Daejeon (KR); Chang Myung Ryu, Gyeonggi-do (KR); Young Jae Lee, Chungcheongnam-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/356,524

(22) Filed: Feb. 16, 2006

(65) Prior Publication Data

US 2006/0207791 A1 Sep. 21, 2006

(30) Foreign Application Priority Data

Mar. 18, 2005 (KR) ............... 10-2005-0022703

(51) Int. Cl.
*H05K 1/16* (2006.01)
(52) U.S. Cl. ............ 174/260; 174/255; 174/256; 174/266; 361/793; 361/762; 361/322; 257/758; 257/774; 29/830; 29/831; 29/846; 205/122; 205/118
(58) Field of Classification Search ........... 174/255, 174/256, 260, 266; 361/793, 762, 322; 257/758, 257/774; 29/830, 831, 846; 205/122, 118
See application file for complete search history.

(56) References Cited

U.S. PATENT DOCUMENTS

| | | | |
|---|---|---|---|
| 5,870,274 A | | 2/1999 | Lucas |
| 6,103,134 A | | 8/2000 | Dunn et al. |
| 6,349,456 B1 | | 2/2002 | Dunn et al. |
| 6,410,380 B2 | * | 6/2002 | Edgar .................. 438/238 |
| 6,565,730 B2 | * | 5/2003 | Chakravorty et al. ....... 205/122 |
| 6,813,138 B1 | * | 11/2004 | Jow et al. ................ 361/306.1 |
| 7,030,815 B2 | * | 4/2006 | Dunn et al. .......... 343/700 MS |
| 2004/0108134 A1 | * | 6/2004 | Borland et al. ............ 174/260 |
| 2004/0118602 A1 | * | 6/2004 | Lee et al. .................. 174/260 |
| 2004/0132279 A1 | * | 7/2004 | Egitto et al. ............... 438/629 |
| 2005/0047062 A1 | * | 3/2005 | Mido et al. ................. 361/523 |
| 2005/0128720 A1 | * | 6/2005 | Croswell et al. ............ 361/763 |
| 2005/0135074 A1 | * | 6/2005 | Dunn et al. ................. 361/763 |
| 2005/0251997 A1 | * | 11/2005 | Homg et al. .................. 29/830 |
| 2006/0014327 A1 | * | 1/2006 | Cho et al. .................. 438/125 |
| 2006/0032666 A1 | * | 2/2006 | Kim et al. .................. 174/255 |
| 2006/0044734 A1 | * | 3/2006 | Ahn et al. ................... 361/313 |
| 2006/0115770 A1 | * | 6/2006 | Hong et al. ................. 430/311 |
| 2006/0243479 A1 | * | 11/2006 | Kim et al. .................. 174/256 |

FOREIGN PATENT DOCUMENTS

KR    1020050000044 A    1/2005

* cited by examiner

*Primary Examiner*—Dean A. Reichard
*Assistant Examiner*—Xiaoliang Chen
(74) *Attorney, Agent, or Firm*—Darby & Darby P.C.

(57) ABSTRACT

The present invention relates to a capacitor-embedded PCB and a method of manufacturing the same. The capacitor-embedded PCB includes a dielectric layer, a lower electrode layer formed under the dielectric layer, and an upper electrode layer formed on the dielectric layer and configured to have at least one first blind via hole that is inwardly formed.

6 Claims, 14 Drawing Sheets

CAPACITOR-EMBEDDED PCB HAVING BLIND VIA HOLE AND METHOD OF MANUFACTURING THE SAME

INCORPORATION BY REFERENCE

The present application claims priority under 35 U.S.C. §119 to Korean Patent Application No. 10-2005-0022703 filed on Mar. 18, 2005. The content of the application is incorporated herein by reference in its entirety.

BACKGROUND OF THE INVENTION

1. Field of the Invention

The present invention relates generally to a printed circuit board and a method of manufacturing the same and, more particularly, to a capacitor-embedded printed circuit board having one or more blind via holes for providing a high capacitance value in a narrow area of an integrated circuit package or a printed circuit board, and a method of manufacturing the same.

2. Description of the Related Art

With the recent development of semiconductor systems towards high integration and high speed, the operational speed and performance of an entire system, including a semiconductor chip, are determined by external factors as well as the internal factors of the semiconductor chip. Therefore, the most important design factor is to secure signal integrity inside and outside a semiconductor chip.

Furthermore, in electronic systems, the high speed switching of a semiconductor chip and the transmission of a high-frequency signal cause noise attributable to electromagnetic interference. In particular, crosstalk noise and simultaneous switching noise between adjacent lines and input/output pins in high-density circuit designs act as factors to degrade the integrity of signals.

Accordingly, problems, such as ground bouncing and power bouncing, that result from a problem in which a number of semiconductor chips are mounted on a high-density Printed Circuit Board (PCB), thereby consuming large power, must be overcome. As a result, the roles of a decoupling capacitor and a bypass capacitor are very important.

Since conventional passive circuit elements cause resonance in an undesired frequency band due to an inductance value attributable to a lead line, a scheme of inserting passive elements into a PCB to overcome the problem has been proposed in the field of the high-density mounting technology for PCBs.

Until now, discrete chip resistors or discrete chip capacitors have been mounted on the surfaces of most PCBs. However, recently, resistor- or capacitor-embedded PCBs have been developed.

In such embedded PCBs, capacitors are buried outside or inside PCBs. A capacitor that is integrated as part of a PCB is referred to as an "embedded (buried) capacitor," and a board including such a capacitor is referred to as a "capacitor-embedded PCB" regardless of the size of a PCB.

Conventionally, capacitor-embedded PCB technology may be mainly classified into four methods.

The first one is a polymer thick film type capacitor implementation method that implements a capacitor by applying polymer capacitor paste and thermally setting the paste, that is, drying the paste. This method manufactures an embedded capacitor by printing and drying copper paste to form electrodes after applying polymer capacitor paste to the inner layer of a PCB and drying the paste.

The second one is an embedded discrete type capacitor implementation method that produces a capacitor by coating a PCB with a ceramic filled photo-dielectric resin. In connection with this method, U.S. Motorola Inc. possesses related patent technology. This method implements a discrete capacitor by coating a PCB with a photo-dielectric resin containing ceramic powder, laminating a copper foil to form upper and lower electrodes, forming a circuit pattern and then etching the photo-dielectric resin.

The third one is a method that produces a capacitor by inserting a separate dielectric having capacitance characteristics into the inner layer of a PCB to replace a decoupling capacitor mounted on the surface of the PCB. In connection with the method, U.S. Sanmina SCI Corp. possesses related patent technology. This method implements a power distributed decoupling capacitor by inserting a dielectric composed of a power electrode and a ground electrode into the inner layer of a PCB.

The fourth one relates to a capacitor-embedded PCB in which polymer capacitor paste, which has a high dielectric constant and is composed of a compound of $BaTiO_3$ and epoxy, is charged in a via hole in the inner layer of a PCB, and a method of manufacturing the same. In connection with this method, Korean Samsung Electro-Mechanics Co., Ltd. possesses related patent technology. This method includes eight steps, from the step of forming a plurality of inner layer via holes in a desired portion of a copper foil-layered plate by forming via holes in a PCB to the step of plating the inner walls of outer layer via holes and through holes.

FIGS. 1A through 1N are sectional views illustrating the flow of a prior art method of manufacturing a capacitor-embedded PCB, which relates to the second method described above.

First, a copper-layered plate in which a first copper foil layer 12 is formed on an insulating layer 11 is prepared, as illustrated in FIG. 1A, and then a photo-dielectric material layer 13 is applied on the first copper foil layer 12, as illustrated in FIG. 1B.

Thereafter, a second copper foil layer 14 is layered on the photo-dielectric material layer 13, as illustrated in FIG. 1C, and a photosensitive film 20a is layered on the second copper foil layer, as illustrated in FIG. 1D.

Thereafter, as illustrated in FIG. 1E, a photo-mask 30a on which a desired capacitor pattern is formed is brought into tight contact with the photosensitive film 20a, and ultraviolet rays 40a are radiated onto the photo-mask 30a. At the time, the ultraviolet rays 40a pass through the non-printed portion 31a of the photo-mask 30a, thus forming a set portion 21a in the photosensitive film 20a under the photo-mask 30a, whereas the ultraviolet rays 40a cannot pass through the printed dark portion 32a of the photo-mask 30a, so that a portion 22a in the photosensitive film 20a under the photo-mask 30a remains unset.

Thereafter, as illustrated in FIG. 1F, after the photo-mask 30a has been removed, the unset portion 22a of the photosensitive film 20a is removed by performing a development process such that the set portion 21a of the photosensitive film 20a can remain.

As shown in FIG. 1G, the upper electrode layer 14a of an embedded capacitor is formed in the second copper foil layer 14 by etching the second copper foil layer 14 using the set portion 21a of the photosensitive film 20a as an etching resist.

As shown in FIG. 1H, after the set portion 21a of the photosensitive film 20a has been removed, ultraviolet rays 40b are radiated onto the photo-dielectric material layer 13 while using the upper electrode layer 14a as a mask. At this time, the portion of the photo-dielectric material layer 13 on which the upper electrode layer 14a is not formed absorbs the ultraviolet rays 40b and forms a reacted portion 13b that can be resolved using a special solvent (for example, Gamma-Butyrolactone (GBL)) in a developing process, and the portion of the photo-dielectric material layer 13 on which the upper electrode layer 14a is formed cannot absorb the ultraviolet rays 40b and forms a portion 13a that does not react.

Thereafter, as illustrated in FIG. 1I, the dielectric layer 13a of an embedded capacitor is formed in the photo-dielectric material layer 13 by removing the portion 13b that reacted with the ultraviolet rays 40b through a developing process.

Thereafter, as illustrated in FIG. 1J, the first copper foil layer 12, the dielectric layer 13a and the upper electrode layer 14a are coated with a photosensitive resin 20b.

Thereafter, as illustrated in FIG. 1K, after a photo-mask 30b in which a desired circuit pattern is formed has been brought into contact with the photosensitive resin 20b, ultraviolet rays 40c are radiated. At this time, ultraviolet rays 40c pass through the non-printed portion 31b of the photo-mask 30b and form a set portion 21b in the photosensitive film 20b under the photo-mask 30b, whereas the ultraviolet rays 40c cannot pass through the printed dark portion 32b of the photo-mask 30b, so that a portion 22b in the photosensitive film 20b under the photo-mask 30b remains unset.

Thereafter, as illustrated in FIG. 1L, after the photo-mask 30b has been removed, the unset portion 22b of the photosensitive film 20b is removed by performing a developing process such that the set portion 21b of the photosensitive film 20b can remain.

Furthermore, as shown in FIG. 1M, the lower electrode layer 12a and circuit pattern 12b of an embedded capacitor are formed in the first copper foil layer 12 by etching the first copper foil layer 12 while using the set portion 21b of the photosensitive resin 20b as an etching resist.

Finally, as shown in FIG. 1N, the set portion 21b of the photosensitive resin 20b is removed. Thereafter, when an insulating layer is layered and a circuit pattern forming process, a solder resist forming process, a nickel/gold plating process and an outline forming process are performed, a capacitor-embedded PCB 10 is manufactured.

U.S. Pat. No. 6,349,456, issued to Motorola, Inc., schematically discloses a method of manufacturing the prior art capacitor-embedded PCB 10 described above.

As described above, the prior art capacitor-embedded PCB 10 is manufactured to exhibit a predetermined capacitance, and the dielectric layer 13a is formed between the two electrode layers 12a and 12b.

As a result, the capacitance value of the embedded capacitor of the prior art capacitor-embedded PCB 10 is determined by the cross section of the embedded capacitor, the distance between the two electrode layers 12a and 14a and the dielectric constant of the dielectric layer 13a.

However, since the embedded capacitor used in IC packages or the PCBs based on the prior art method is constructed to have a planar form using a flat copper plate between the layers of a substrate, the prior art embedded capacitor has a structural problem in that a high capacitance value cannot be realized.

SUMMARY OF THE INVENTION

Accordingly, the present invention has been made keeping in mind the above problems occurring in the prior art, and an object of the present invention is to provide a capacitor-embedded PCB having a high capacitance value using a blind via hole, and a method of manufacturing the same.

In order to accomplish the above object, the present invention provides a capacitor-embedded PCB having one or more blind via holes, including a dielectric layer; a lower electrode layer formed under the dielectric layer; and an upper electrode layer formed on the dielectric layer and configured to have one or more first blind via holes that are inwardly formed.

In another embodiment of the present invention, the capacitor-embedded PCB further includes an insulating layer formed under the lower electrode layer, wherein the lower electrode layer includes one or more second blind via holes that are inwardly formed.

In order to accomplish the above object, the present invention provides a method of manufacturing a capacitor-embedded PCB having one or more blind via holes, including the steps of (A) forming one or more blind via holes inwardly in one side of a dielectric layer; and (B) forming an upper electrode layer and a lower electrode layer by forming plate layers on both sides of the dielectric layer and inner walls of the blind via holes, so as to provide electrical conductivity to the blind via holes.

In order to accomplish the above object, the present invention provides a method of manufacturing a capacitor-embedded PCB having one or more blind via holes, including the steps of (A) forming one or more first blind via holes in one side of an insulating layer; (B) forming a lower electrode layer by forming a plated layer on a surface of the insulating layer, including the first blind via holes, so as to provide electrical conductivity to the first blind via holes; (C) forming a dielectric layer on the lower electrode layer; (D) forming one or more second blind via holes inwardly in the dielectric layer; and (E) forming an upper electrode layer by forming a plated layer on the dielectric layer and the inner walls of the second blind via holes, so as to provide electrical conductivity to the second blind via holes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1A:
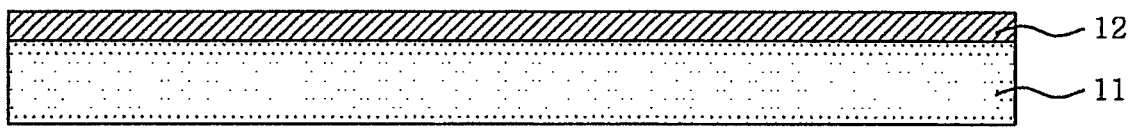
FIGS. 1A through 1N are sectional views illustrating the flow of a method of manufacturing a prior art capacitor-embedded PCB.
Figure 1B:
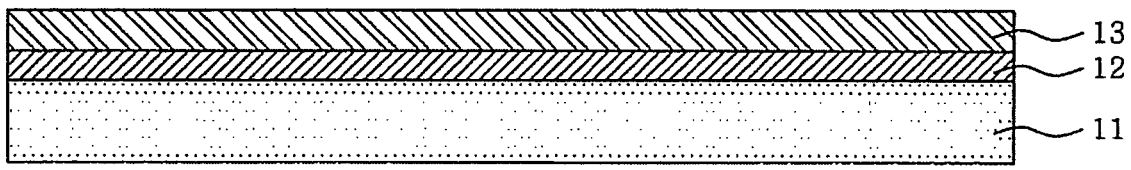
Figure 1C:
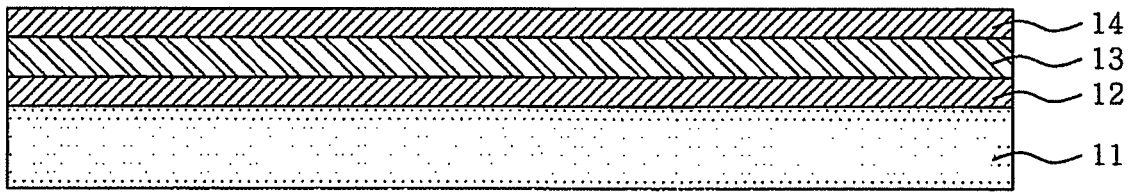
Figure 1D:
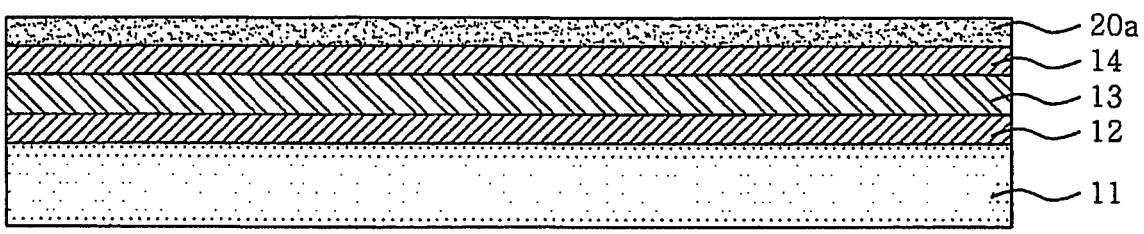
Figure 1E:
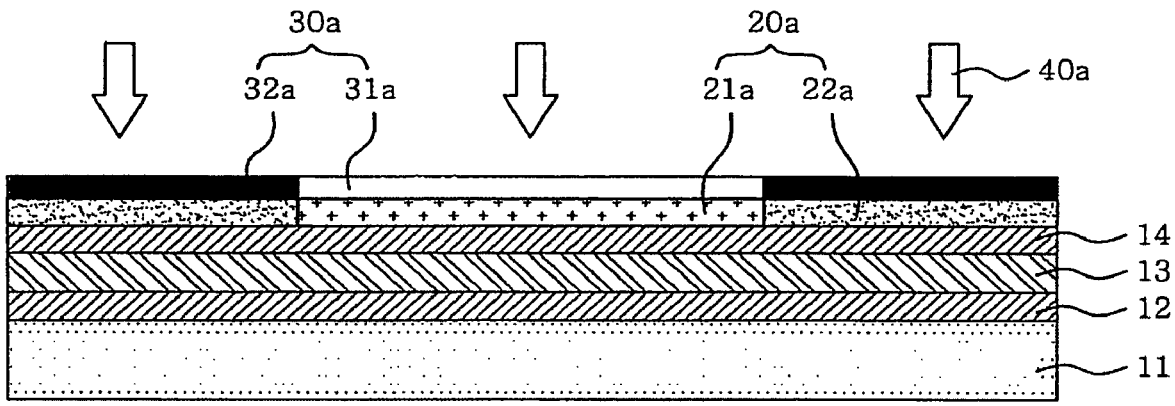
Figure 1F:
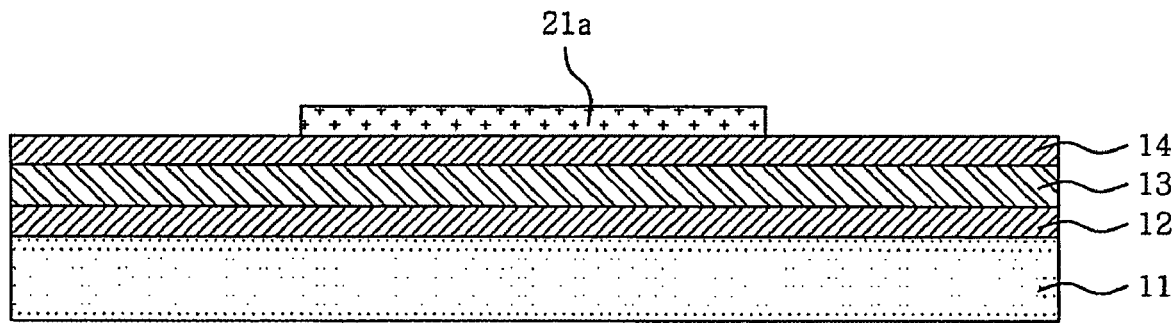
Figure 1G:
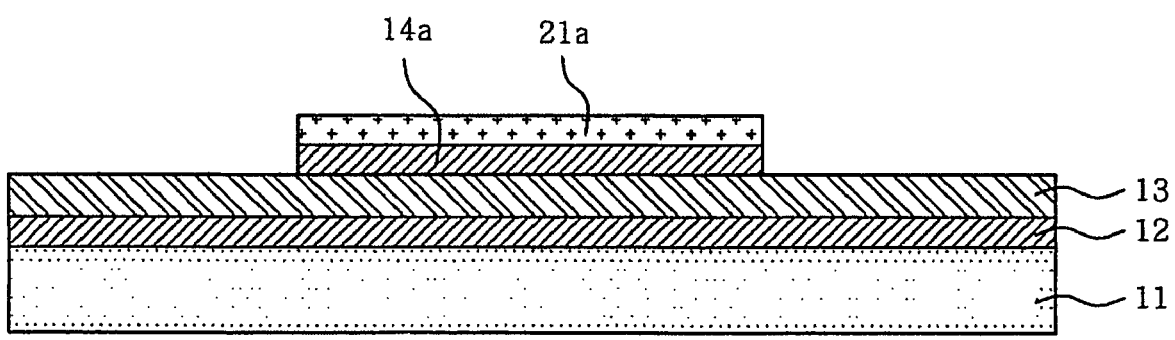
Figure 1H:
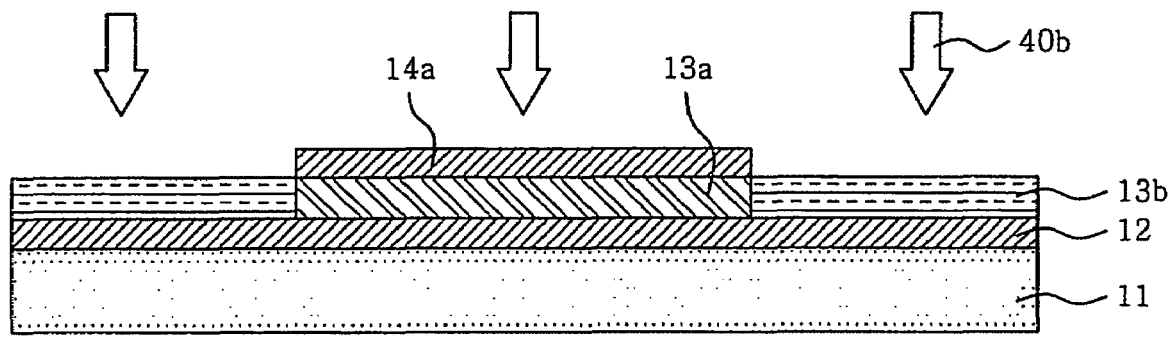
Figure 1I:
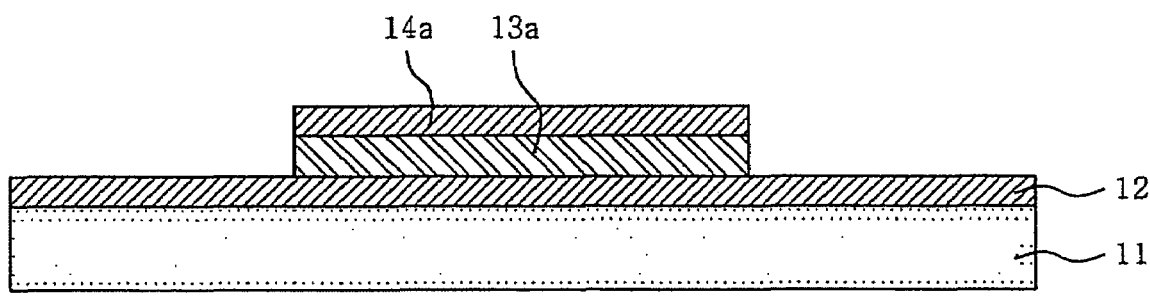
Figure 1J:
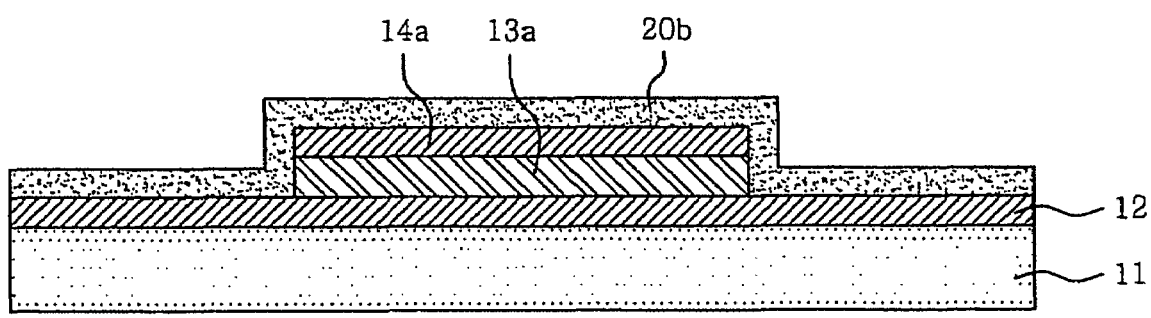
Figure 1K:
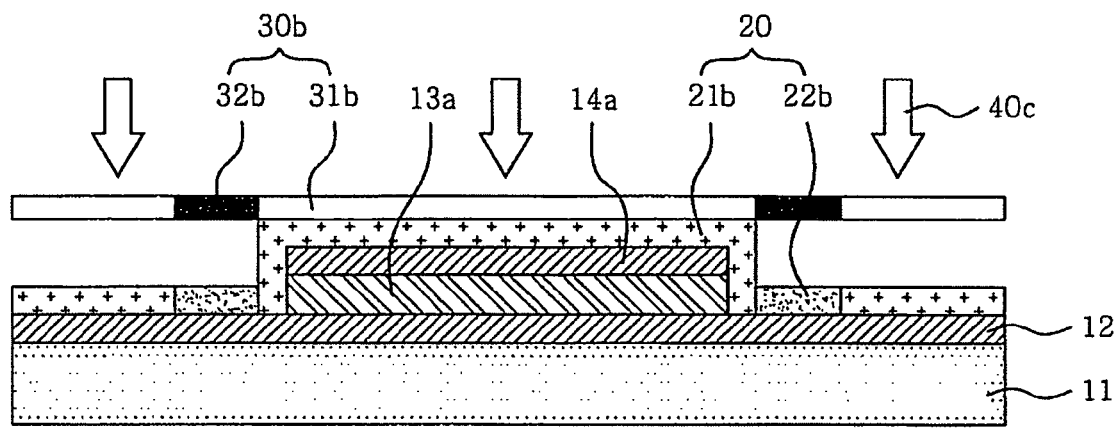
Figure 1L:
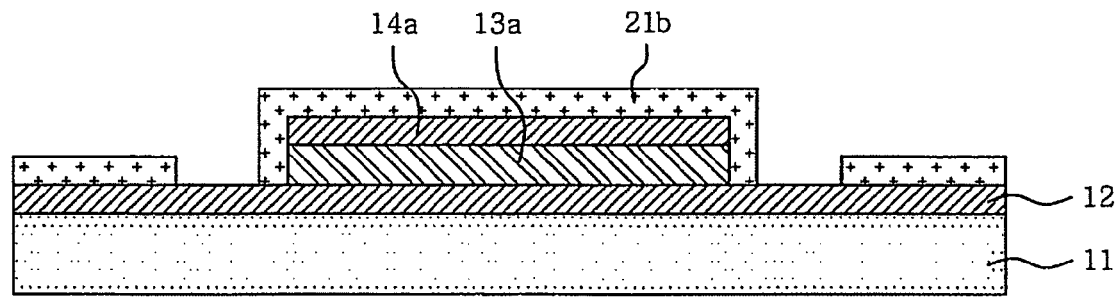
Figure 1M:
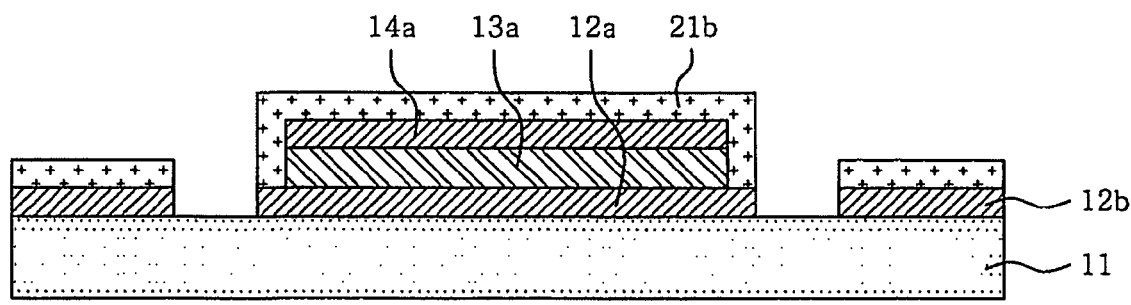
Figure 1N:
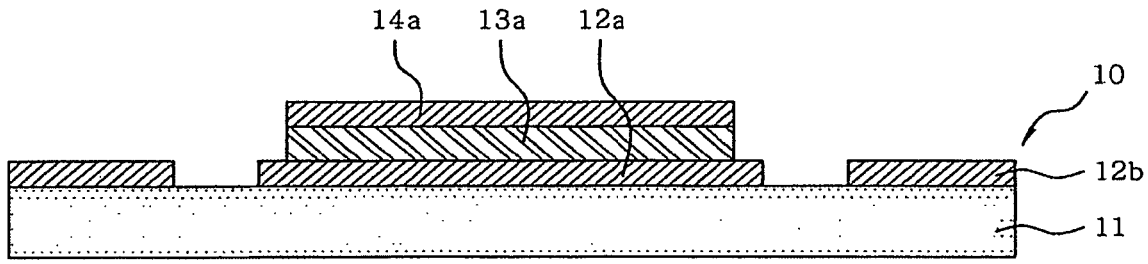

Reference now should be made to the drawings, in which the same reference numerals are used throughout the different drawings to designate the same or similar components.

A capacitor-embedded PCB having a blind via hole and a method of manufacturing the same in accordance with the present invention are described in detail with reference to the accompanying drawings.

Figure 2A:
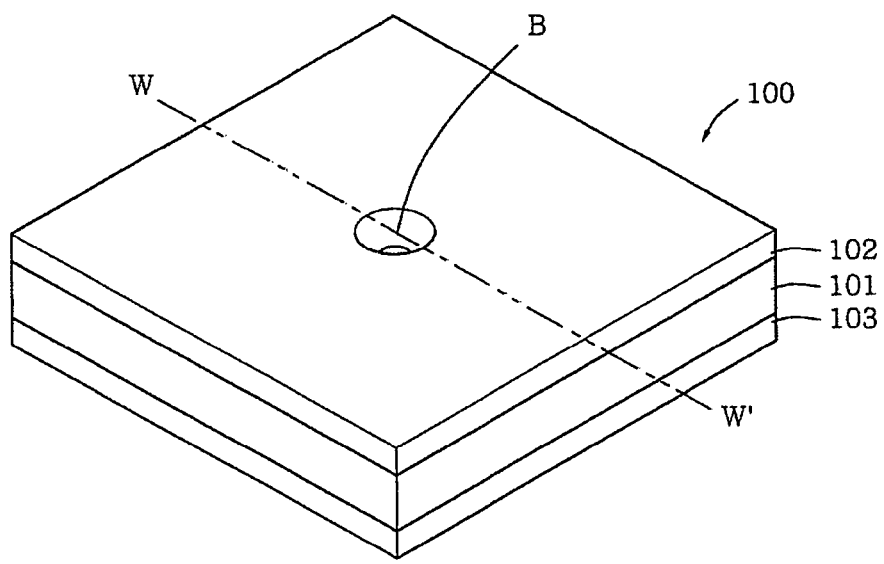
FIG. 2A is a perspective view illustrating a capacitor-embedded PCB having a blind via hole in an upper electrode layer in accordance with an embodiment of the present invention.
Figure 2B:
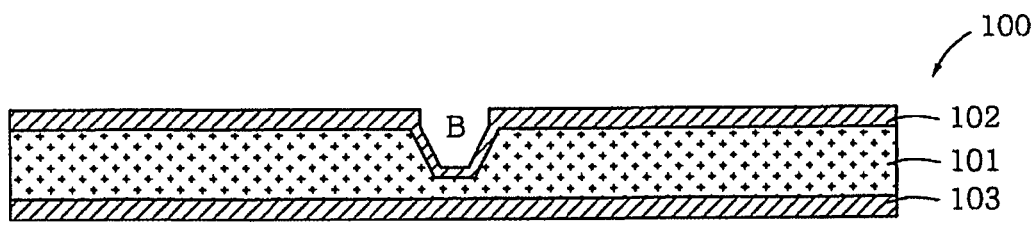
FIG. 2B is a sectional view taken along line W-W' of FIG. 2A, which illustrates the capacitor-embedded PCB having a blind via hole.

FIG. 2A is a perspective view illustrating a capacitor-embedded PCB having a blind via hole in an upper electrode layer in accordance with an embodiment of the present invention, and FIG. 2B is a sectional view taken along line W-W' of FIG. 2A, which illustrates the capacitor-embedded PCB having a blind via hole.

As shown in FIGS. 2A and 2B, a capacitor-embedded PCB 100 having a blind via hole B according to the embodiment of the present invention includes a dielectric layer 101, an upper electrode layer 102 having the blind via hole B, and a lower electrode layer 103.

Preferably, the dielectric layer 101 is made of a material having a high dielectric constant so as to increase a capacitance value.

The upper electrode layer 102 is formed on the dielectric layer 101, and includes the single blind via hole B, which is inwardly formed. Although the upper electrode layer 102 may be made of any material that has high electrical conductivity, it is preferred that the upper electrode layer 102 be made of Cu, which is mainly used in a PCB and has high electrical conductivity.

The lower electrode layer 103 is formed under the dielectric layer 101, and may be made of any material that has high electrical conductivity, like the upper electrode layer 102.

As described above, the capacitor-embedded PCB according to the present embodiment includes the single blind via hole B, which is inwardly formed, so that the cross section of the embedded capacitor increases and the distance between the upper electrode layer 102 and the lower electrode layer 103 decreases, thus increasing a capacitance value.

FIGS. 3A through 3D are sectional views illustrating the flow of a method of manufacturing a capacitor-embedded PCB having a single blind via hole in an upper electrode layer, according to the present embodiment.

Figure 3A:
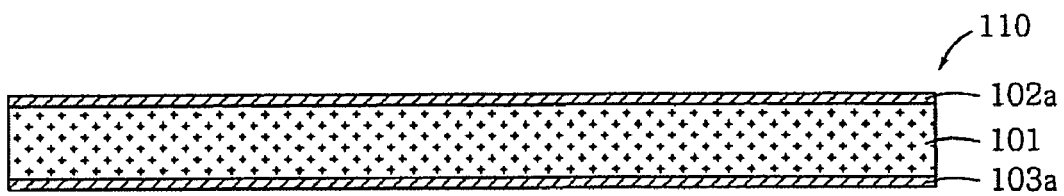
FIGS. 3A through 3D are sectional views illustrating the flow of a method of manufacturing a capacitor-embedded PCB having a single blind via hole in an upper electrode layer, according to an embodiment of the present invention.

As shown in FIG. 3A, an original plate 110, including a dielectric layer 101 and copper foils 102a and 103a formed on both sides of the dielectric layer 101, is prepared.

In this case, it is preferred that the dielectric layer 101 used in the original plate 110 be made of a material having a high dielectric constant so as to increase a capacitance value.

Figure 3B:
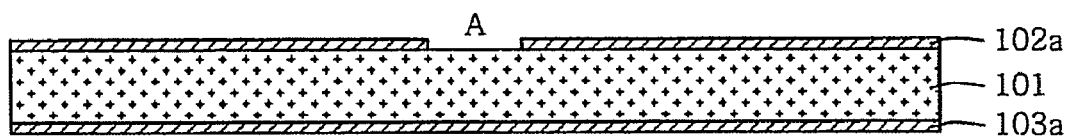

As illustrated in FIG. 3b, a single window A is formed in the upper copper foil 102a of the dielectric layer 101 at a predetermined location using a photo-lithography process.

A method of forming the window A is performed by applying a dry film or a photosensitive material on the upper copper foil 102a to form an etching resist, forming a window pattern A at a desired location using exposing and developing processes, removing the portion of the copper foil 102a corresponding to the window pattern A using a photo-lithography process, and then removing the dry film or the photosensitive material applied to the upper copper foil 102a of the dielectric layer 101 using a stripping process, thereby forming the window A in the upper copper foil 102a at a predetermined location. In the developing process, $Na_2CO_3$ or $K_2CO_3$ is preferably used as a developer, and in the stripping process, a stripping solution including NaOH or KOH is preferably used.

Figure 3C:
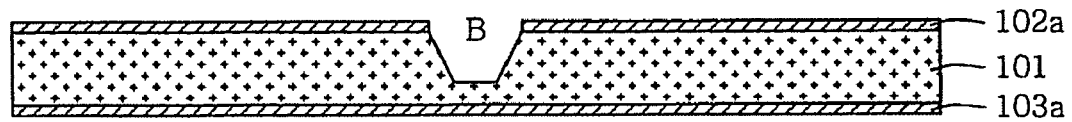

As shown in FIG. 3C, the single blind via hole B is formed by forming the dielectric layer 101 at a predetermined location using a laser and the window A.

When the blind via hole B is formed, a short circuit is generated if the bottom surface of the blind via hole B comes into contact with a lower copper foil 103a. Accordingly, it is preferable to keep the depth of the blind via hole B appropriate.

A $CO_2$ laser may be used as the laser.

In a preferred embodiment, it is preferable to further perform a desmear process that eliminates a smear that is formed on the inner wall of the blind via hole B by the dielectric layer 101 that is melted by heat while forming the blind via hole B, after the formation of the single blind via hole B using a laser process.

In another preferred embodiment, the blind via hole B may be formed using an Yttrium Aluminum Garnet (YAG) laser instead of the $CO_2$ laser. In this case, the YAG laser can handle the copper foil 102b formed on the dielectric layer 101, so that the blind via hole can be formed without the window forming process shown in FIG. 3B.

Figure 3D:
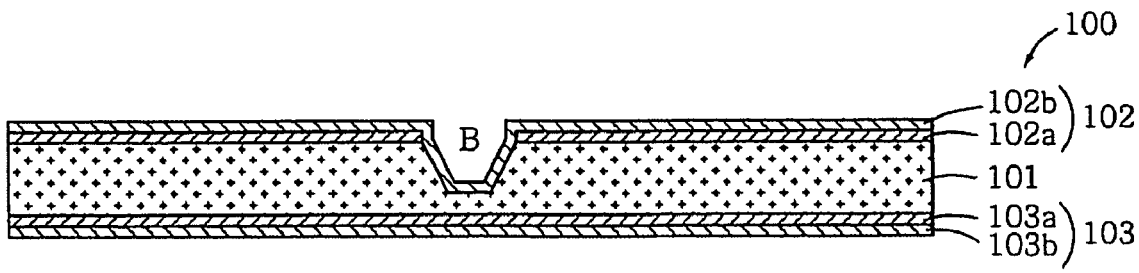

As illustrated in FIG. 3D, when the plated layers 102b and 103b are formed using a material (for example, Cu) having high electrical conductivity so as to electrically connect the inner wall of one blind via hole B, the embedded capacitor, including the blind via hole B in one side thereof, is manufactured.

In this case, the copper foil 102a and the plated layer 102b on the upper side of the dielectric layer 101 constitute the upper electrode layer 102 of the capacitor, and the copper foil 103a and the plated layer 103b on the lower side thereof constitute the lower electrode layer 103.

Figure 4A:
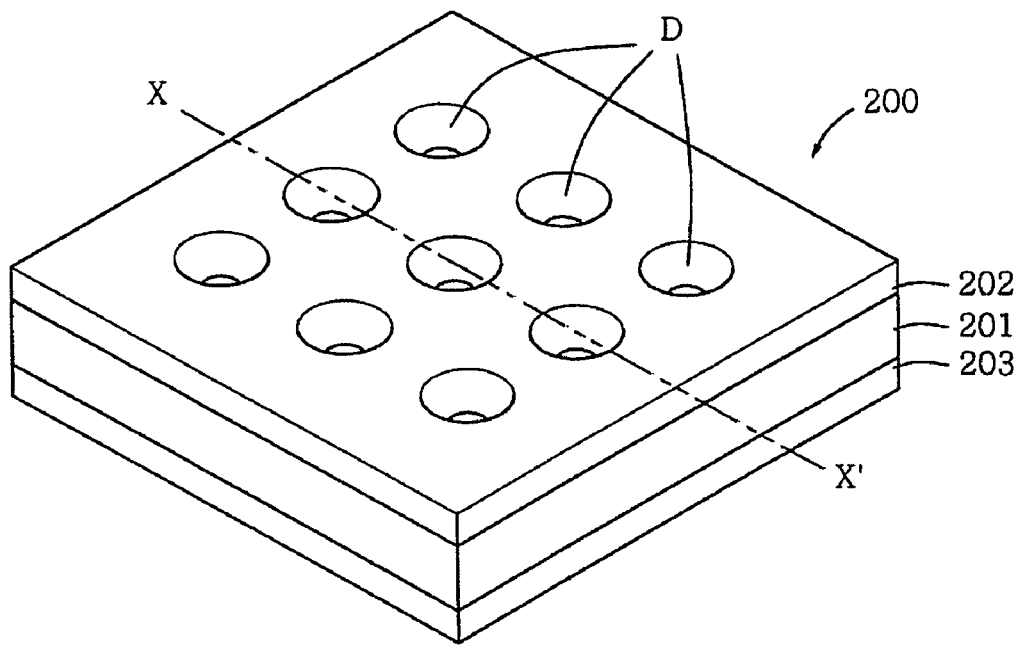
FIG. 4A is a perspective view illustrating a capacitor-embedded PCB having a plurality of blind via holes in an upper electrode layer, according to another embodiment of the present invention.
Figure 4B:
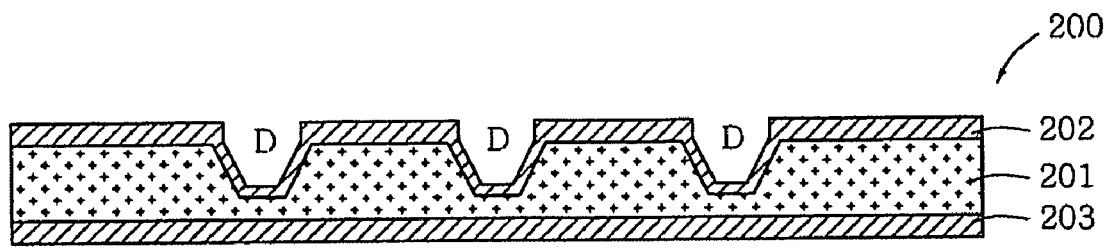
FIG. 4B is a sectional view taken along line X-X' of FIG. 4A, which illustrates the capacitor-embedded PCB having the blind via holes.

FIG. 4A is a perspective view illustrating a capacitor-embedded PCB having a plurality of blind via holes in an upper electrode layer, according to another embodiment of the present invention. FIG. 4B is a sectional view taken along line X-X' of FIG. 4A, which illustrates the capacitor-embedded PCB having the blind via holes.

As shown in FIGS. 4A and 4B, a capacitor-embedded PCB 200 having blind via holes D according to the present embodiment includes a dielectric layer 201, an upper electrode layer 202 having a plurality of blind via holes D, and a lower electrode layer 203.

It is preferred that the dielectric layer 201 be made of a material having a high dielectric constant so as to increase a capacitance value.

The upper electrode layer 202 is formed on the dielectric layer 201, and includes a plurality of blind via holes D, which are inwardly formed. The upper electrode layer 202 may be any material that has high electrical conductivity.

The lower electrode layer 203 is formed under the dielectric layer 201, and may be made of any material that has high electrical conductivity, like the upper electrode layer 202.

Table 1 shows simulation data for the capacitance value of an embedded capacitor having nine blind via holes according to the present embodiment and the capacitance value of a prior art embedded capacitor having no blind via holes. In this case, conditions including the cross sections of the embedded capacitors, the distances between two electrode layers and the dielectric constant of the dielectric layers are the same.

TABLE 1

| | |
|---|---|
| Embedded capacitor having nine blind via holes | 5.8672 pF |
| Embedded capacitor having no blind via holes | 5.2514 pF |
| Increase in capacitance value | 11.2% |

As can be seen in table 1, the capacitance value of the embedded capacitor having nine blind via holes according to the present invention is higher than the capacitance value of the prior art embedded capacitor having no blind via holes, therefore the present invention can provide a high capacity capacitor-embedded PCB.

FIGS. 5A through 5D are sectional views illustrating the flow of a method of manufacturing a capacitor-embedded PCB having a plurality of blind via holes in an upper electrode layer, according to the present embodiment.

Figure 5A:
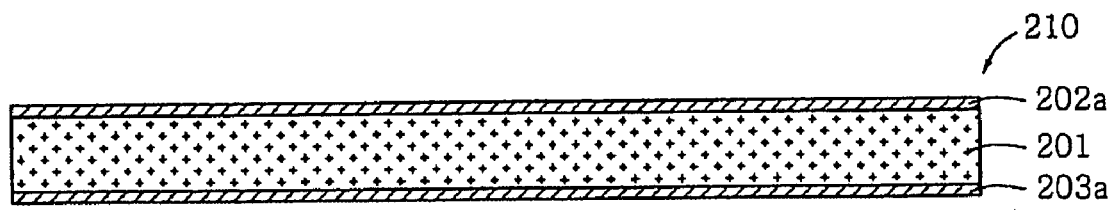
FIGS. 5A through 5D are sectional views illustrating the flow of a method of manufacturing a capacitor-embedded PCB having a plurality of blind via holes in an upper electrode layer, according to the embodiment of the FIG. 4A.

As shown in FIG. 5A, an original plate 210, including a dielectric layer 201 and copper foils 202a and 203a formed on both sides thereof, is prepared.

In this case, it is preferred that the dielectric layer 201 of the original plate 210 be made of a material having a high dielectric constant so as to increase a capacitance value.

Figure 5B:
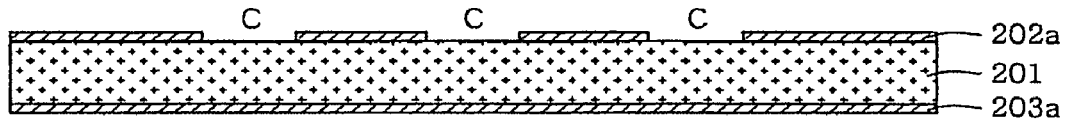

As illustrated in FIG. 5B, a plurality of windows C is formed in the upper copper foil 202a of the dielectric layer 201 at predetermined locations using a photo-lithography process.

Figure 5C:
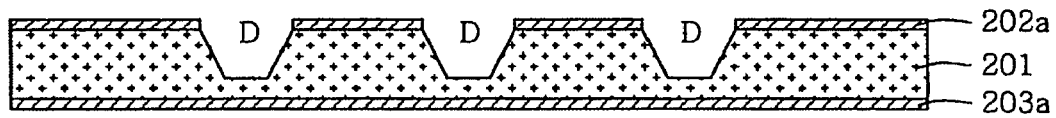

As shown in FIG. 5C, a plurality of blind via holes D is formed by processing the dielectric layer 201 using a laser and the windows C formed in the upper copper foil 202a of the dielectric layer 201.

When the blind via holes D are formed, a short circuit is generated if the bottom surfaces of the blind via holes D come into contact with a lower copper foil 203a. Accordingly, it is preferable to keep the depth of the blind via holes D appropriate.

A $CO_2$ laser or YAG laser may be used as the laser. A desmear process for eliminating smears that are formed on the inner walls of the blind via holes D may be further performed.

Figure 5D:
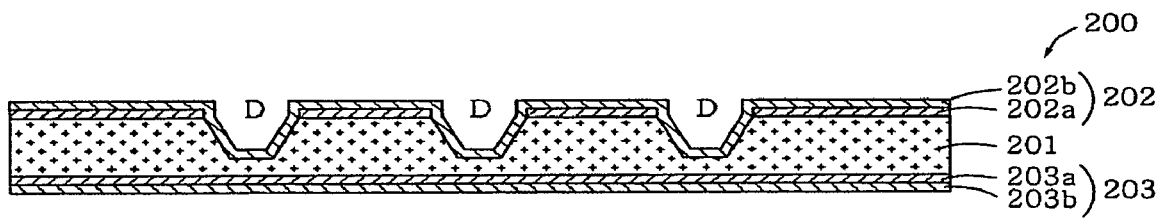

As illustrated in FIG. 5D, when plated layers 202b and 203b are formed using a material having high electrical conductivity so as to electrically connect the inner walls of the blind via holes D, the embedded capacitor including the plurality of blind via holes in one side thereof is achieved.

In this case, the copper foil 202a and the plated layer 202b on the upper side of the dielectric layer 201 constitute the upper electrode layer 102 of the capacitor, and the copper foil 203a and the plated layer 203b on the lower side thereof constitute the lower electrode layer.

Figure 6A:
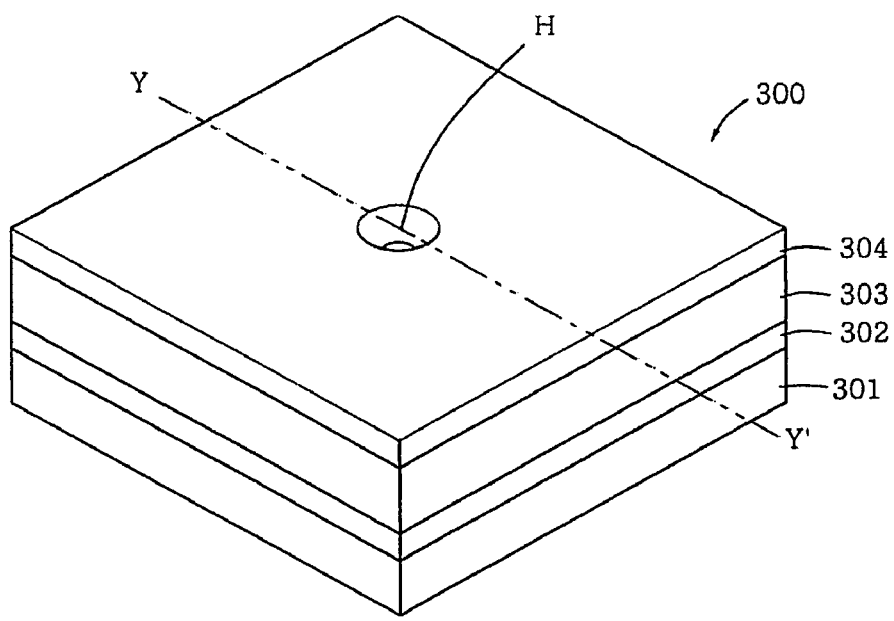
FIG. 6A is a perspective view illustrating a capacitor-embedded PCB having blind via holes in upper and lower electrode layers, according to yet another embodiment of the present invention.
Figure 6B:
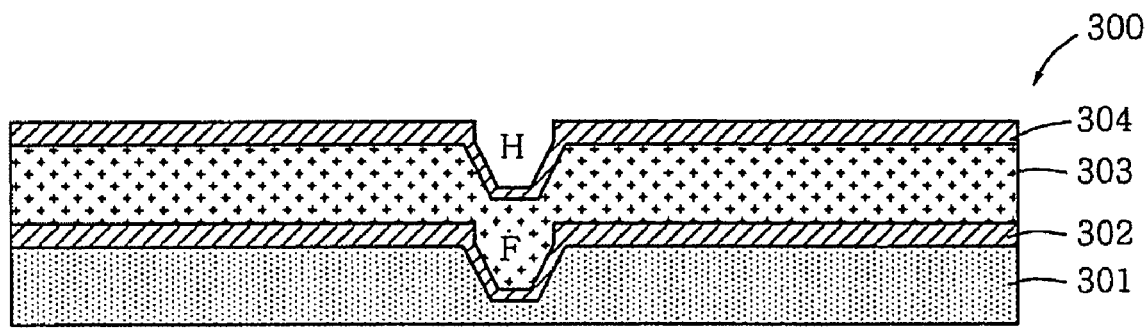
FIG. 6B is a sectional view taken along line Y-Y' of FIG. 6A, which illustrates the capacitor-embedded PCB having the blind via holes.

FIG. 6A is a perspective view illustrating a capacitor-embedded PCB having blind via holes in upper and lower electrode layers, according to yet another embodiment of the present invention. FIG. 6B is a sectional view taken along line Y-Y' of FIG. 6A, which illustrates the capacitor-embedded PCB having the blind via holes.

As shown in FIGS. 6A and 6B, a capacitor-embedded PCB 300 having blind via holes F and H according to the present embodiment includes an insulating layer 301, a lower electrode layer 302 having a first blind via hole F, a dielectric layer 303, and an upper electrode layer 304 having a second blind via hole H.

The insulating layer 301 functions to support the lower electrode layer 302, dielectric layer 303 and upper electrode layer 304 of the embedded capacitor formed thereon.

The lower electrode layer 302 is formed on the insulating layer 301, and includes the first blind via hole F, which is inwardly formed. The lower electrode layer 302 may be made of any material that has high electrical conductivity.

Preferably, the dielectric layer 303 is made of a material having a high dielectric constant so as to increase a capacitance value.

The upper electrode layer 304 is formed on the dielectric layer 303, and includes the second blind via hole H, which is inwardly formed. The upper electrode layer 304 may also be made of any material that has high electrical conductivity, like the lower electrode layer 302.

FIGS. 7A through 7H are sectional views illustrating the flow of a method of manufacturing a capacitor-embedded PCB having blind via holes in an upper electrode layer and a lower electrode layer, according to the present embodiment.

Figure 7A:
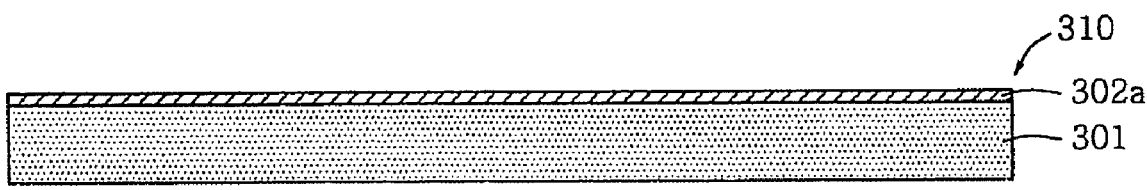
FIGS. 7A through 7H are sectional views illustrating the flow of a method of manufacturing a capacitor-embedded PCB having a blind via hole in each of the upper and lower electrode layers, according to the embodiment of FIG. 6A.

As shown in FIG. 7A, an original plate 310, including the dielectric layer 301 and a copper foil 302a formed on one side thereof, is prepared.

Figure 7B:
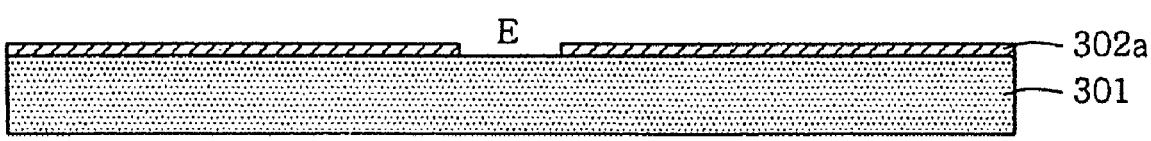

As illustrated in FIG. 7B, a first window E is formed in the copper foil 302a, which is formed on one side of the insulating layer 301, at a desired location using a photo-lithography process.

Figure 7C:
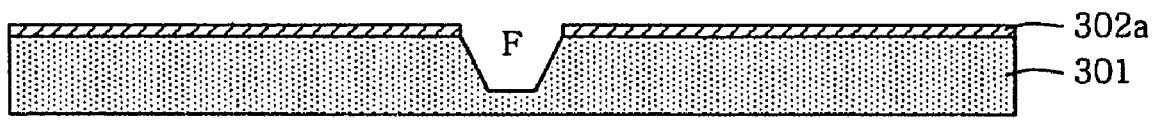

As shown in FIG. 7C, the first blind via hole F is formed by processing the insulating layer 301 using a laser and the first window E formed in the upper copper foil 302a of the insulating layer 301.

In this case, it is preferable to further perform a desmear process so as to eliminate a smear that is formed on the inner wall of the blind via hole F.

Figure 7D:
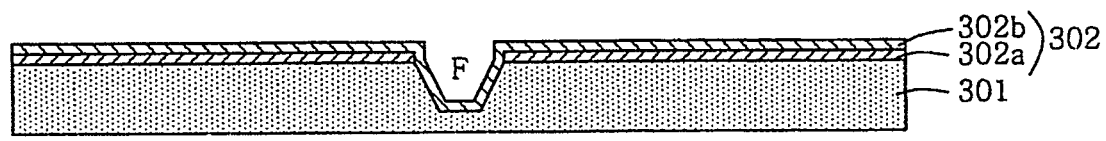

As shown in FIG. 7D, conductivity is provided by forming a plated layer 302b on the inner wall of the first blind via hole F for electrical conduction.

In this case, the upper copper foil 302a and plated layer 302b of the insulating layer 301 constitutes the lower electrode layer 302 of the embedded capacitor.

Figure 7E:
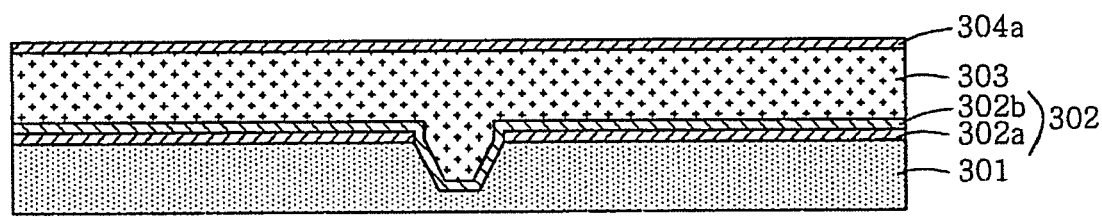

As shown in FIG. 7E, after the dielectric layer 303 has been layered on the lower electrode layer 302, a copper foil 304a is layered on the dielectric layer 303.

It is preferred that the dielectric layer 303 have a high dielectric constant so as to increase a capacitance value.

Figure 7F:
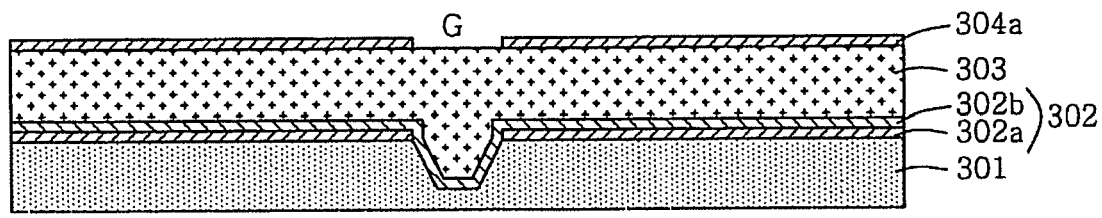

As shown in FIG. 7F, the second window G is formed in the copper foil 304a, which is formed on the dielectric layer 303, using a photo-lithography process.

In that case, the location of the second window G may be set immediately above that of the first blind via hole F. When the second via hole is formed using the second window G in subsequent processes, the location can prevent the second via hole from coming into contact with the lower electrode layer 302 and thus generating a short circuit.

Figure 7G:
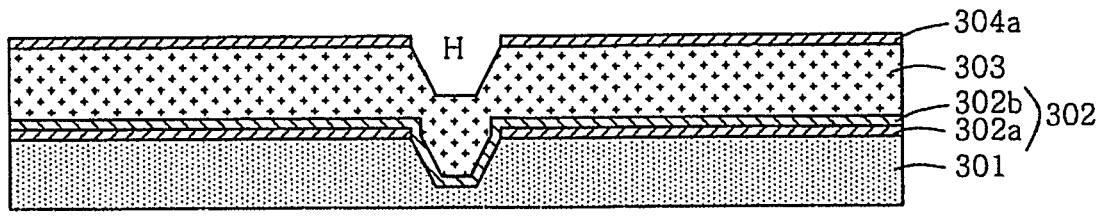

As shown in FIG. 7G, the second blind via hole H is formed by processing the dielectric layer 303 using a laser and the second window G.

In this case, it is preferable to further perform a desmear process so as to eliminate a smear formed on the inner wall of the blind via hole H.

Figure 7H:
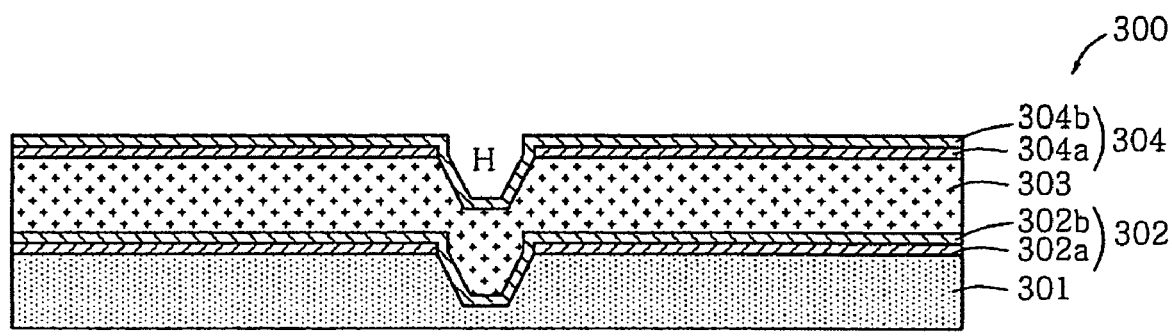

As illustrated in FIG. 7H, when the plated layer 304b is formed on the inner wall of one second blind via hole H to provide electrical conduction, and provides conductivity, the embedded capacitor, including the blind via holes F and H on both sides thereof, is achieved.

The copper foil 304a and the plated layer 304b formed on the insulating layer 303 constitute the upper electrode layer 304 of an embedded capacitor.

Figure 8A:
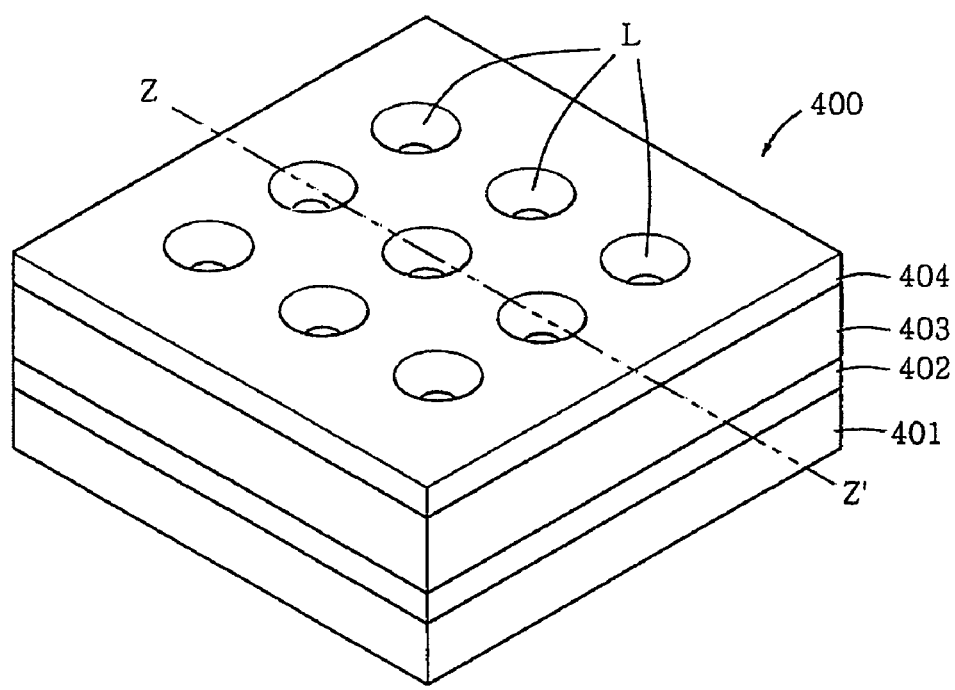
FIG. 8A is a perspective view illustrating a capacitor-embedded PCB having a plurality of blind via holes in upper and lower electrode layers, according to a further embodiment of the present invention.
Figure 8B:
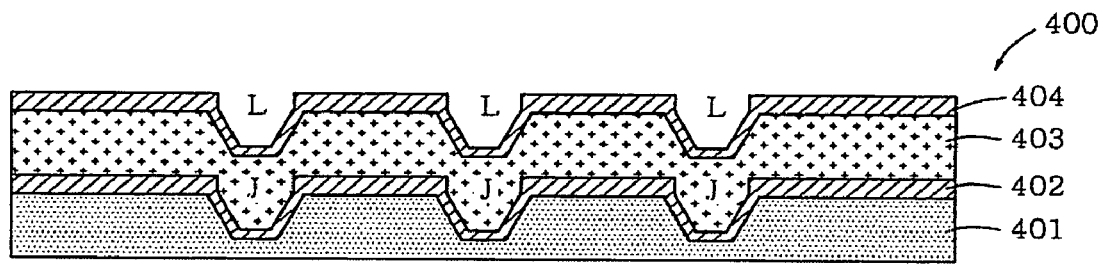
FIG. 8B is a sectional view taken along line Z-Z' of FIG. 8A, which illustrates the capacitor-embedded PCB having the blind via holes.

FIG. 8A is a perspective view illustrating a capacitor-embedded PCB having a plurality of blind via holes in upper and lower electrode layers, according to a further embodiment of the present invention. FIG. 8B is a sectional view taken along line Z-Z' of FIG. 8A, which illustrates the capacitor-embedded PCB having the blind via holes.

As shown in FIGS. 8A and 8B, a capacitor-embedded PCB 400 having blind via holes J and L according to the present embodiment includes an insulating layer 401, a lower electrode layer 402 having a plurality of first blind via holes J, a dielectric layer 403, and an upper electrode layer 404 having a plurality of second blind via holes L.

The insulating layer 401 functions to support the lower electrode layer 402, dielectric layer 403 and upper electrode layer 404 of the embedded capacitor 400 formed thereon.

The lower electrode layer 402 is formed on the insulating layer 401, and includes the first blind via holes J, which are inwardly formed. The lower electrode layer 402 may be made of any material that has high electrical conductivity.

It is preferred that the dielectric layer 403 be made of a material having a high dielectric constant so as to increase a capacitance value.

The upper electrode layer 404 is formed on the dielectric layer 403, and includes the second blind via holes L, which are inwardly formed. The upper electrode layer 404 may also be made of any material that has high electrical conductivity, like the lower electrode layer 402.

Table 2 shows simulation data for the capacitance value of an embedded capacitor having nine blind via holes in each of the upper and lower electrode layers according to the present embodiment and the capacitance value of a prior art embedded capacitor having no blind via holes. In this case, conditions, including the cross sections of the embedded capacitors, the distances between two electrode layers, and the dielectric constant of the dielectric layers, are the same.

TABLE 2

| | |
|---|---|
| Embedded capacitor having nine blind via holes in each of the upper and lower electrode layers | 6.6992 pF |
| Embedded capacitor having no blind via holes | 5.2514 pF |
| Increase in capacitance value | 27.6% |

As can be seen in table 2, the capacitance value of the embedded capacitor having nine blind via holes according to the present invention is higher than that of the prior art embedded capacitor having no blind via holes, so that a high capacity capacitor-embedded PCB can be achieved.

FIGS. 9A through 9H are sectional views illustrating the flow of a method of manufacturing a capacitor-embedded PCB having a plurality of blind via holes in each of the upper and lower electrode layers, according to the present embodiment.

Figure 9A:
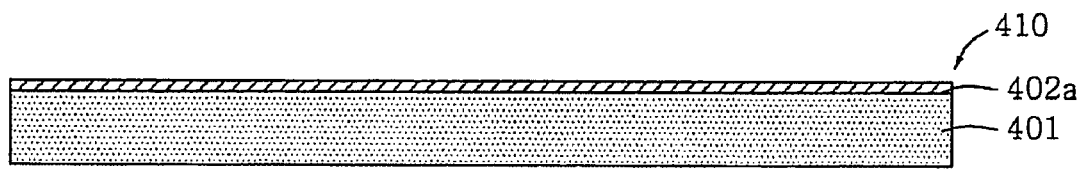
FIGS. 9A through 9H are sectional views illustrating the flow of a method of manufacturing a capacitor-embedded PCB having a plurality of blind via holes in each of the upper and lower electrode layers, according to the embodiment of FIG. 8A.

As shown in FIG. 9A, an original plate 410, including the dielectric layer 401 and a copper foil 402a formed on one side thereof, is prepared.

Figure 9B:
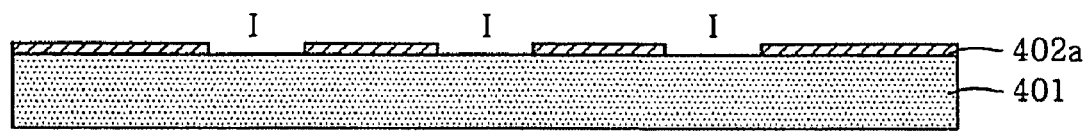

As illustrated in FIG. 9B, the plurality of first windows I is formed in the copper foil 402a on one side of the insulating layer 401 at predetermined locations using a photo-lithography process.

Figure 9C:
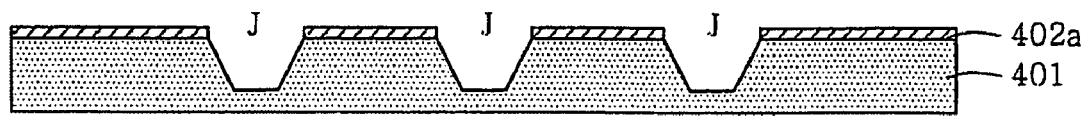

As shown in FIG. 9C, the plurality of first blind via holes J is formed by processing the insulating layer 401 using a laser and the plurality of first windows I formed in the upper copper foil 402a of the insulating layer 401.

Figure 9D:
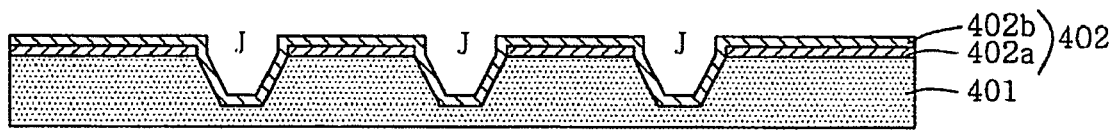

As shown in FIG. 9D, a plated layer 402b is formed on the inner walls of the first blind via holes J to provide electrical conduction, thus providing conductivity.

In this case, the upper copper foil 402a and plated layer 402b of the insulating layer 401 constitute the lower electrode layer 402 of the embedded capacitor 400.

Figure 9E:
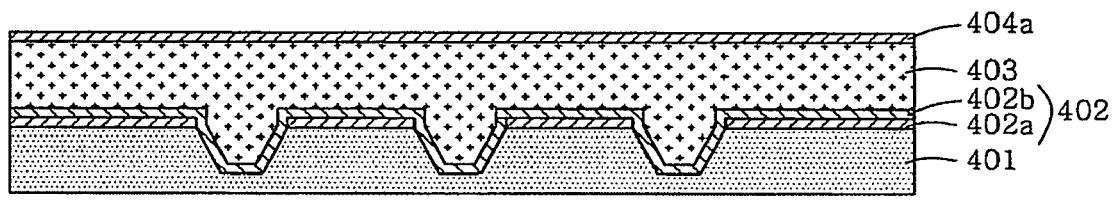

As shown in FIG. 9E, after the dielectric layer 403 has been layered on the lower electrode layer 402, a copper foil 404a is layered on the dielectric layer 403.

Figure 9F:
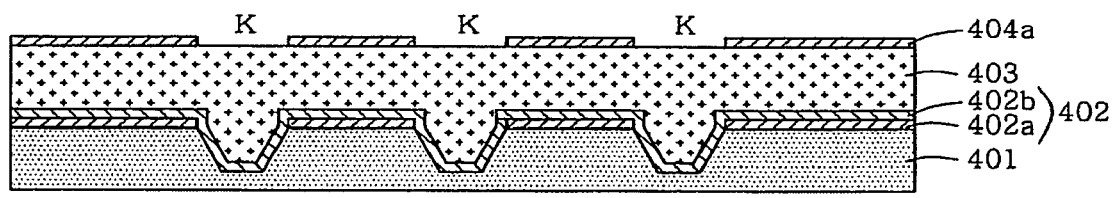

As shown in FIG. 9F, a plurality of second windows K are formed in the copper foil 404a, which is formed on the dielectric layer 403, using a photo-lithography process.

The locations of the second windows K may be set immediately above those of the first blind via holes J.

Figure 9G:
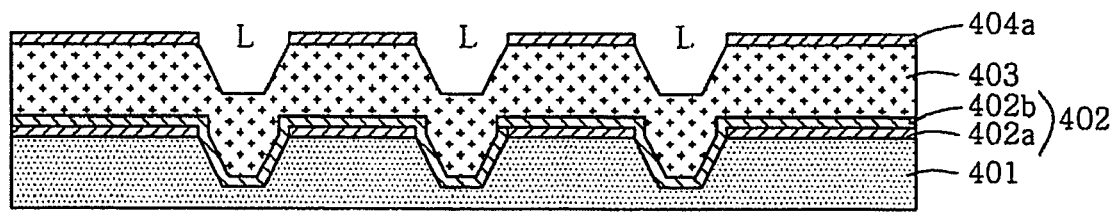

As shown in FIG. 9G, the plurality of second blind via holes L is formed by processing the dielectric layer 403 using a laser and the second windows K.

In this case, it is preferable to further perform a desmear process so as to eliminate smears that are formed on the inner walls of the blind via holes L.

Figure 9H:
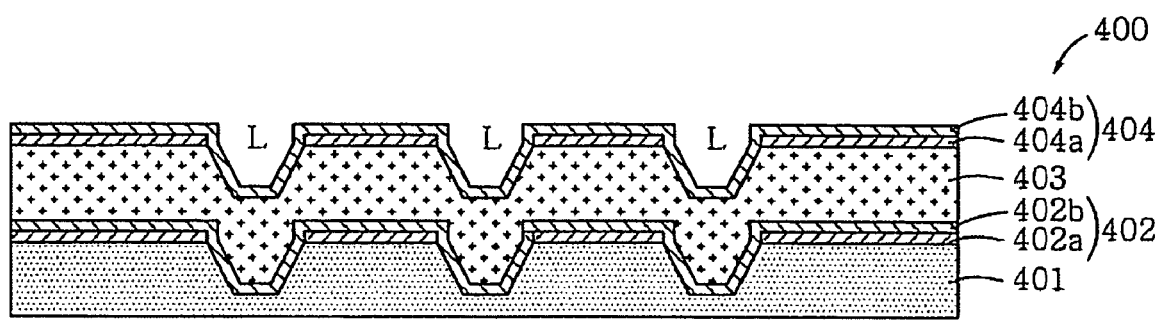

As illustrated in FIG. 9H, when the plated layer 404b is formed on the inner walls of the second blind via holes L to provide electrical conduction, and provides conductivity, the embedded capacitor, including the blind via holes in both sides of the original plate, is achieved.

The copper foil 404a and the plated layer 404b formed in the insulating layer 403 constitute the upper electrode layer 404 of the embedded capacitor.

As described above, in accordance with the capacitor-embedded PCB and a method of manufacturing the same according to the present invention, a three-dimensional copper plate can be implemented using blind via hole(s) and, thus, a high capacitance value can be realized, so that the present invention can be effectively used for small-sized electronic devices, such as a mobile phone and a Moving Picture Experts Group-1 Audio Layer-3 (MP3) player, in which a large number of elements must be used on a narrow substrate. Additionally, a large number of capacitors can be implemented in a small area.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A capacitor-embedded Printed Circuit Board (PCB) having at least one blind via hole, comprising:
   a dielectric layer;
   a lower electrode layer formed under the dielectric layer; and
   an upper electrode layer formed on the dielectric layer and configured to have at least one first blind via hole that is inwardly formed and extends only partway through the dielectric layer without contacting the lower electrode layer.

2. The capacitor-embedded PCB as set forth in claim 1, further comprising an insulating layer formed under the lower electrode layer;
   wherein the lower electrode layer includes at least one second blind via hole that is inwardly formed.

3. The capacitor-embedded PCB as set forth in claim 2, wherein at least one of the first and second blind via holes are formed at an identical location in a direction perpendicular to a surface of the lower electrode layer.

4. A method of manufacturing a capacitor-embedded PCB having at least one blind via hole, comprising the steps of:
   forming at least one blind via hole inwardly in one side of a dielectric layer; and
   forming an upper electrode layer and a lower electrode layer by forming plate layers on both sides of the dielectric layer and on inner walls of the blind via hole, so as to provide electrical conductivity between the plate layer on the inner walls the blind via hole and the plate layer on the one side of the dielectric layer,
   wherein the step of forming the at least one blind via hole comprises the step of forming the at least one blind via hole to extend only partway through the dielectric layer between the upper electrode layer and the lower electrode layer, without providing electrical contact between the plate layer on the inner walls and the lower electrode layer.

5. A method of manufacturing a capacitor-embedded PCB having at least one blind via hole, comprising the steps of:
   forming at least one first blind via hole in one side of a first insulating layer;
   forming a lower electrode layer by forming a plated layer on a surface of the first insulating layer, including inner walls of the at least one first blind via hole, so as to provide electrical conductivity between the plate layer on the inner walls of the first blind via hole and the plate layer on the surface of the first insulating layer;
   forming a second dielectric layer on the lower electrode layer;
   forming at least one second blind via hole inwardly in the second dielectric layer; and
   forming an upper electrode layer by forming a plated layer on the second dielectric layer and inner walls of the at least one second blind via hole, so as to provide electrical conductivity between the plate layer on the inner walls of the second blind via hole and the plate layer on the second dielectric layer,
   wherein the at least one second blind via hole extends only partway through the dielectric layer between the upper electrode layer and the lower electrode layer, without providing electrical contact between the plate layer on the inner walls and the lower electrode layer.

6. The method as set forth in claim 5, wherein the step of forming the at least one second blind via hole comprises the step of forming one of the at least one first blind via hole and one of the at least one second blind via hole at an identical location in a direction perpendicular to a surface of the lower electrode layer.

* * * * *